(12) United States Patent
Ma et al.

(10) Patent No.: US 9,759,756 B2
(45) Date of Patent: Sep. 12, 2017

(54) CIRCUIT AND METHOD FOR THREE-PHASE DETECTION, AND COMPRESSOR

(71) Applicant: Danfoss (Tianjin) Ltd., Tianjin (CN)

(72) Inventors: Zhenqiang Ma, Tianjin (CN); Jingyuan Li, Tianjin (CN); Huapeng Zeng, Tianjin (CN)

(73) Assignee: Danfoss (Tianjin) Ltd., Tianjin (CN)

( * ) Notice: Subject to any disclaimer, the term of this patent is extended or adjusted under 35 U.S.C. 154(b) by 0 days.

(21) Appl. No.: 14/967,534

(22) Filed: Dec. 14, 2015

(65) Prior Publication Data
US 2016/0169952 A1    Jun. 16, 2016

(30) Foreign Application Priority Data
Dec. 15, 2014    (CN) .......................... 2014 1 0775649

(51) Int. Cl.
G01R 31/02    (2006.01)
G01R 29/18    (2006.01)
H02P 29/024    (2016.01)

(52) U.S. Cl.
CPC .......... *G01R 29/18* (2013.01); *H02P 29/0241* (2016.02)

(58) Field of Classification Search
CPC .............................. G02B 6/26; H02P 29/0241
See application file for complete search history.

(56) References Cited

U.S. PATENT DOCUMENTS

2016/0356824 A1*    12/2016    Wu ........................ G01R 19/22

FOREIGN PATENT DOCUMENTS

| CN | 2708552 Y | 7/2005 |
|---|---|---|
| CN | 1866659 A | 11/2006 |
| CN | 101799520 A | 8/2010 |
| CN | 101871982 A | 10/2010 |
| CN | 203444023 U | 2/2014 |
| CN | 204101643 U | 1/2015 |
| CN | 104360173 A | 2/2015 |

* cited by examiner

*Primary Examiner* — Karen Masih
(74) *Attorney, Agent, or Firm* — McCormick, Paulding & Huber LLP

(57) ABSTRACT

A circuit for three-phase detection, a method for three-phase detection and a compressor are provided. The circuit for three-phase detection includes a first optical coupler and a second optical coupler. A first input end and a second input end of the first optical coupler are respectively connected to a first phase wire and a third phase wire of a power supply assembly, and a first output end of the first optical coupler provides a first output signal. A first input end and a second input end of the second optical coupler are respectively connected to a second phase wire and the third phase wire of the power supply assembly, and a first output end of the second optical coupler provides a second output signal. The first output signal and the second output signal are used to indicate a phase state of a three-phase alternating current of the power supply assembly.

14 Claims, 5 Drawing Sheets

CIRCUIT AND METHOD FOR THREE-PHASE DETECTION, AND COMPRESSOR

CROSS REFERENCE TO RELATED APPLICATIONS

Applicant hereby claims foreign priority benefits under U.S.C. §119 from Chinese Patent Application Serial No. CN201410775649.0 filed on Dec. 15, 2014, the contents of which are incorporated by reference herein.

FIELD OF THE INVENTION

The present invention relates to the field of circuit technologies, and in particular, to a circuit for three-phase detection, a method for three-phase detection, and a compressor to which the circuit for three-phase detection and/or the method for three-phase detection are/is applied.

BACKGROUND

Three-phase alternating current is widely applied in various fields. Generally, a three-phase alternating current system transmits electricity by using three live lines whose phases differ by 120 degrees, where a neutral wire is optionally included. Phases of the three live lines may be separately referred to as a U phase, a V phase, and a W phase. The phases of a three-phase alternating current may change due to a change of a working environment and/or a malfunction in a circuit, for example, phase loss or phase reversal, thereby causing damage to electrical equipment. Therefore, it is necessary to detect the phases of the three-phase alternating current, in order to ensure that the electrical equipment works in a normal power supply condition.

However, there are too many components in most conventional solutions for three-phase circuit detection, and therefore, the conventional solutions have complex structures, and thus have high costs while poor reliability.

SUMMARY

In view of the foregoing, an aspect of the present invention provides a circuit for three-phase detection. The circuit for three-phase detection includes a first optical coupler and a second optical coupler, where a first input end and a second input end of the first optical coupler are respectively connected to a first phase wire and a third phase wire of a power supply assembly, and a first output end of the first optical coupler provides a first output signal; and a first input end and a second input end of the second optical coupler are respectively connected to a second phase wire and the third phase wire of the power supply assembly, and a first output end of the second optical coupler provides a second output signal, where waveforms of the first output signal and the second output signal are used to indicate a phase state of a three-phase alternating current of the power supply assembly.

Another aspect of the present invention provides a compressor. The compressor includes: a compression member, a motor, and the circuit for three-phase detection described above, where the motor is configured to drive the compression member to compress a medium that enters the compressor; and the circuit for three-phase detection is connected to the motor, and is configured to detect a phase state of the motor.

According to another aspect of the present invention, a method for three-phase detection is provided. The method includes: receiving, by a first optical coupler, a signal of a first phase wire and a signal of a third phase wire that are from a power supply assembly, and outputting a first output signal according to the signal of the first phase wire and the signal of the third phase wire; receiving, by a second optical coupler, a signal of a second phase wire and the signal of the third phase wire of the power supply assembly, and providing a second output signal according to the signal of the second phase wire and the signal of the third phase wire; and detecting, based on the first output signal and the second output signal, a phase state of a three-phase alternating current of the power supply assembly.

BRIEF DESCRIPTION OF THE DRAWINGS

The present invention will be described in more detail with reference to the accompanying drawings. The accompanying drawings are intended to describe rather than limit the present invention. The accompanying drawings are not drawn to scale, and shapes thereof are also examples, rather than exactly correspond to shapes of actual products.

DETAILED DESCRIPTION

Embodiments of the present invention are described below with reference to the accompanying drawings. It should be understood that, the following implementation manners are examples but not exhaustive, and are merely used to describe the principle of the present invention, rather than to limit the scope of the present invention.

In a conventional solution of three-phase detection, phase loss or phase reversal is detected by using three or four optical couplers, a corresponding operational amplifier circuit and a microcontroller. Too many components are needed, a circuit structure is complex, costs are high, and reliability is poor.

Figure 1:
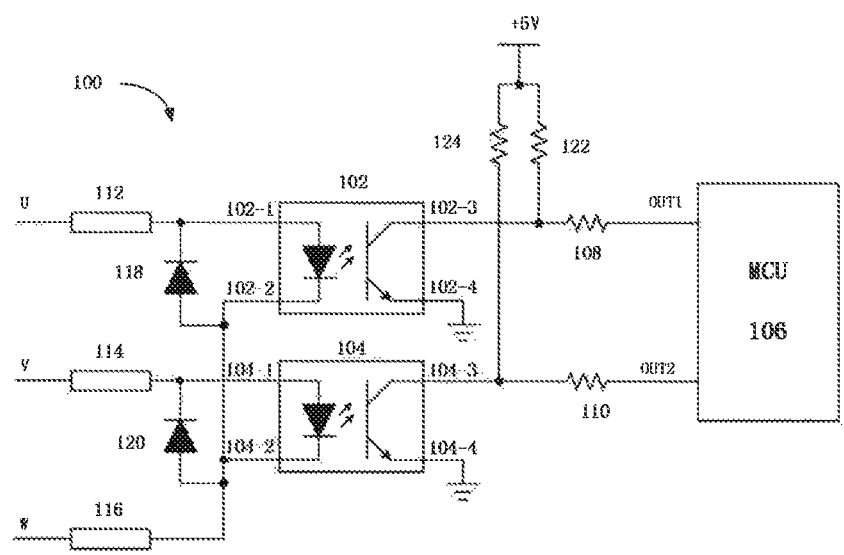
FIG. 1 shows a circuit for three-phase detection according to an embodiment of the present invention.

FIG. 1 shows a circuit for three-phase detection 100 according to an embodiment of the present invention. The circuit for three-phase detection 100 is used to detect phases of a three-phase alternating current, where transmission is performed in the three-phase alternating current by using a first phase wire, a second phase wire, and a third phase wire. It should be noted that, "first", "second", "third" and the like that are used in this text are merely used to differentiate different objects, which does not means that there is any specific sequential relationship between these objects.

As shown in FIG. 1, the circuit for three-phase detection 100 in this embodiment of the present invention includes a first optical coupler 102 and a second optical coupler 104. A first input end 102-1 and a second input end 102-2 of the first optical coupler 102 are respectively connected to a first phase wire U and a third phase wire W. A first output end 102-3 of the first optical coupler provides a first output signal OUT1. A first input end 104-1 and a second input end 104-2 of the second optical coupler 104 are respectively connected to a second phase wire V and the third phase wire W. A first output end 104-3 of the second optical coupler 104 provides a second output signal OUT2. Waveforms of the first output signal OUT1 and the second output signal OUT2 are used to indicate a phase state, for example, phase loss and/or phase reversal, of the three phases U, V, W of the three-phase alternating current.

Figure 2A:
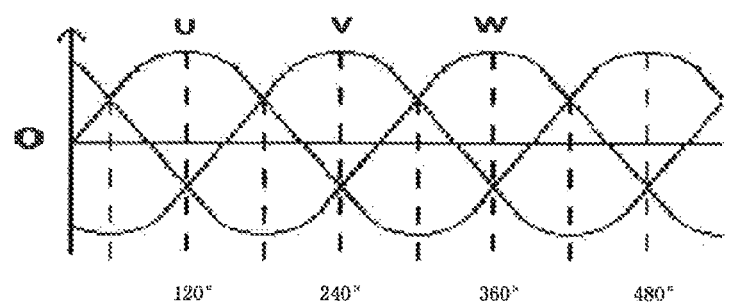
FIG. 2A shows a waveform diagram of a three-phase alternating current in a normal phase state.
Figure 2B:
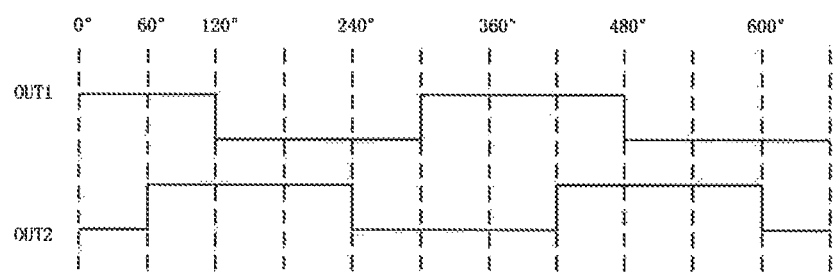
FIG. 2B shows, according to an embodiment of the present invention, waveform diagrams of a first output signal and a second output signal of the circuit for three-phase detection when the three-phase alternating current is in a normal phase state.

FIG. 2A shows a waveform diagram of the three-phase alternating current in a normal phase state. As shown in FIG. 2A, the three phases U, V, W of the three-phase alternating current are respectively sine waves with a phase difference of 120 degrees. FIG. 2B shows waveforms of the first output signal OUT1 and the second output signal OUT2 when the three-phase alternating current is in a normal phase state. As shown in FIG. 2B, in a normal phase state, the first output signal OUT1 and the second output signal OUT2 are square wave signals that have a same period, and a rising edge of the first output signal OUT1 precedes a rising edge of the second output signal OUT2 by ⅓ of a square wave period (that is, a phase of the first output signal OUT1 precedes that of the second output signal OUT2 by 120 degrees).

Table 1 shows states of the first output signal OUT1 and the second output signal OUT2, when phase loss occurs in at least one phase of the three phases U, V, W according to this embodiment of the present invention.

TABLE 1

| Number | The phase state | The states of OUT1 and OUT2 |
|---|---|---|
| 1 | Phase loss occurs in the U phase wire | OUT1 is at a high electrical level, and OUT2 is a square wave |
| 2 | Phase loss occurs in the V phase wire | OUT2 is at a high electrical level, and OUT1 is a square wave |
| 3 | Phase loss occurs in the W phase wire | OUT1 and OUT2 have square waves with the same phase |
| 4 | Phase loss occurs in the U phase wire and the V phase wire | Both OUT1 and OUT2 are at high electrical levels |

TABLE 1-continued

| Number | The phase state | The states of OUT1 and OUT2 |
|---|---|---|
| 5 | Phase loss occurs in the U phase wire and the W phase wire | Both OUT1 and OUT2 are at high electrical levels |
| 6 | Phase loss occurs in the V phase wire and the W phase wire | Both OUT1 and OUT2 are at high electrical levels |
| 7 | Phase loss occurs in the U phase wire, the V phase wire and the W phase wire | Both OUT1 and OUT2 are at high electrical levels |

As shown in Table 1, when the first output signal OUT1 is at a high electrical level and the second output signal OUT2 is a square wave signal, it indicates that phase loss occurs in the first phase wire U; when the second output signal OUT2 is at a high electrical level and the first output signal OUT1 is a square wave signal, it indicates that phase loss occurs in the second phase wire V; when the first output signal OUT1 and the second output signal OUT2 are square wave signals with the same phase, it indicates that phase loss occurs in the third phase wire W; and when both the first output signal and the second output signal are at high electrical levels, it indicates that phase loss occurs in at least two wires of the first, second, and third phase wires.

Figure 3A:
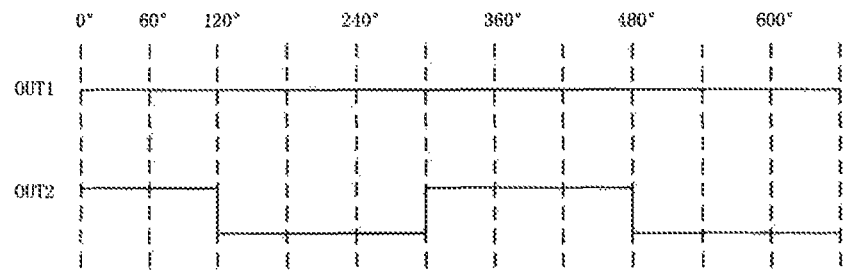
FIG. 3A shows, according to the embodiment of the present invention, waveform diagrams of the first output signal and the second output signal of the circuit for three-phase detection when phase loss occurs in a first phase wire of the three-phase alternating current.

FIG. 3A shows waveform diagrams of the first output signal OUT1 and the second output signal OUT2 when phase loss occurs in the first phase wire U. As shown in FIG. 3A, when phase loss occurs in the first phase wire U, the first output signal OUT1 maintains a high electrical level, and the second output signal OUT2 is a square wave signal.

Figure 3B:
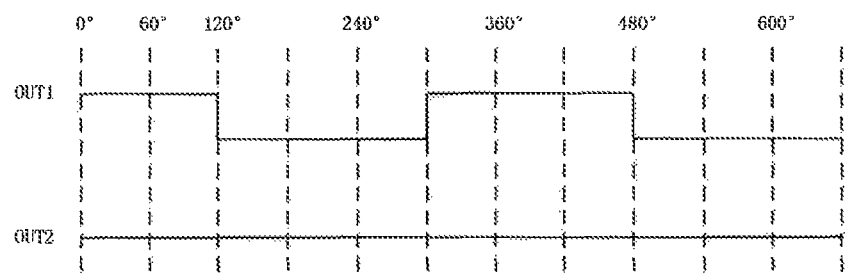
FIG. 3B shows, according to an embodiment of the present invention, waveform diagrams of the first output signal and the second output signal of the circuit for three-phase detection when phase loss occurs in a second phase wire of the three-phase alternating current.

FIG. 3B shows waveform diagrams of the first output signal OUT1 and the second output signal OUT2 when phase loss occurs in the second phase wire V. As shown in FIG. 3B, when phase loss occurs in the second phase wire V, the first output signal OUT1 is a square wave signal and the second output signal OUT2 is at a high electrical level.

Figure 3C:
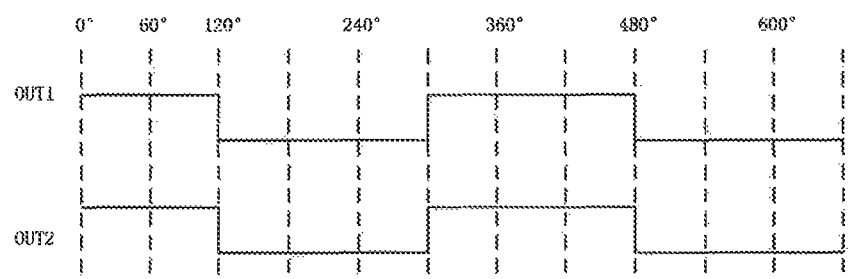
FIG. 3C shows, according to an embodiment of the present invention, waveform diagrams of the first output signal and the second output signal of the circuit for three-phase detection when phase loss occurs in a third phase wire of the three-phase alternating current.

FIG. 3C shows waveform diagrams of the first output signal OUT1 and the second output signal OUT2 when phase loss occurs in the third phase wire W. As shown in FIG. 3C, when phase loss occurs in the third phase wire W, the first output signal OUT1 and the second output signal OUT2 are square wave signals with the same phase.

Figure 3D:
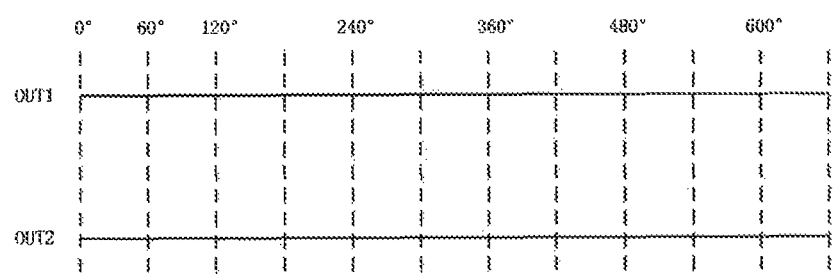
FIG. 3D shows, according to an embodiment of the present invention, waveform diagrams of the first output signal and the second output signal of the circuit for three-phase detection when phase loss occurs in at least two phases of wires of the three-phase alternating current.

FIG. 3D shows waveform diagrams of the first output signal OUT1 and the second output signal OUT2 when phase loss occurs in two or three phases of the first phase wire U, the second phase wire V and the third phase wire W. As shown in FIG. 3D, when phase loss occurs in the third phase wire W, both the first output signal OUT1 and the second output signal OUT2 are at high electrical levels.

In this manner, a phase loss state of the three-phase alternating current may be detected by a simple circuit structure, and an output signal that indicates the phase loss state of the three-phase alternating current is provided.

Table 2 shows states of the first output signal OUT1 and the second output signal OUT2 when phase reversal occurs in two phases of the three phases U, V, W according to this embodiment of the present invention.

TABLE 2

| Number | The phase state | The states of OUT1 and OUT2 |
|---|---|---|
| 1 | Phase reversal occurs in the U phase wire and the V phase wire | OUT1 does not precede OUT2 by ⅓ of the square wave period |

TABLE 2-continued

| Number | The phase state | The states of OUT1 and OUT2 |
|---|---|---|
| 2 | Phase reversal occurs in the U phase wire and the W phase wire | |
| 3 | Phase reversal occurs in the V phase wire and the W phase wire | |

Figure 4:
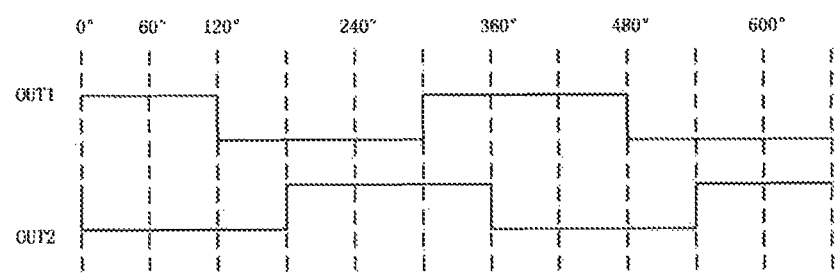
FIG. 4 shows, according to the embodiment of the present invention, waveform diagrams of the first output signal and the second output signal of the circuit for three-phase detection when phase reversal occurs in two phases of wires of the three-phase alternating current.

As shown in Table 2, when the first output signal OUT1 does not precede the second output signal OUT2 by ⅓ of the square wave period, it indicates that phase reversal occurs in two phases of the first, second and third phase wires. In this case, waveforms of the first output signal OUT1 and the second output signal OUT2 are shown in FIG. 4.

According to this embodiment of the present invention, as shown in FIG. 1, the circuit for three-phase detection 100 may further include a micro control unit (MCU) 106, where the first output end 102-3 of the first optical coupler 102 and the first output end 104-3 of the second optical coupler 104 are respectively connected to a first input end and a second input end of the micro control unit through a first output resistor 108 and a second output resistor 110 respectively. Based on the first output signal OUT1 and the second output signal OUT2 that are respectively from the first optical coupler 102 and the second optical coupler 104, the micro control unit 106 detects the phase loss and/or phase reversal of the three-phase alternating current with reference to relationship(s) shown in Table 1 and/or Table 2. The micro control unit 106 may be implemented by a general processor executing program instructions, or may be implemented by a specific integrated circuit, or may be implemented by completely a hardware circuit. According to this embodiment of the present invention, the micro control unit may store a detection result, or generate an alarming signal or turn off an electrical appliance when the phase loss and/or phase reversal is detected.

In an implementation manner, when the first output signal OUT1 maintains a high electrical level and the second output signal OUT2 is a square wave signal, the micro control unit 106 detects that phase loss occurs in the first phase wire U. When the second output signal OUT2 maintains a high electrical level and the first output signal OUT1 is a square wave signal, the micro control unit 106 detects that phase loss occurs in the second phase wire V. When the first output signal OUT1 and the second output signal OUT2 are square wave signals with the same phase, the micro control unit 106 detects that phase loss occurs in the third phase wire W. When both the first output signal and the second output signal maintain high electrical levels, the micro control unit 106 detects that phase loss occurs in at least two phases of the first, second and third phase wires. When the first output signal OUT1 does not precede the second output signal OUT2 by ⅓ of the square wave period, the micro control unit 106 detects that phase reversal occurs in two phases of the first, second, and third phase wires.

According to an embodiment of the present invention, as shown in FIG. 1, the circuit for three-phase detection 100 may further include a first sampling resistor 112, a second sampling resistor 114, and a third sampling resistor 116. The first input end 102-1 of the first optical coupler 102 is connected to the first phase wire U through the first sampling resistor 112. The first input end 104-1 of the second optical coupler 104 is connected to the second phase wire V through the second sampling resistor 114. Both the second input end 102-2 of the first optical coupler 102 and the second input end 104-2 of the second optical coupler 104 are connected to the third phase wire W through the third sampling resistor 116.

According to an embodiment of the present invention, the circuit for three-phase detection 100 may further include a first diode 118 and a second diode 120. The first diode 118 is connected between the first input end 102-1 and the second input end 102-2 of the first optical coupler 102. The second diode 120 is connected between the first input end 104-1 and the second input end 104-2 of the second optical coupler 104. The first diode 118 and the second diode 120 protect the optical couplers from being damaged by a reverse voltage.

According to an embodiment of the present invention, the circuit for three-phase detection 100 may further include a first pull-up resistor 122 and a second pull-up resistor 124 that function as pull-up resistors for outputs of optical couplers. The first output end 102-3 of the first optical coupler 102 is connected to a working voltage through the first pull-up resistor 122, and the first output end 104-3 of the second optical coupler 104 is connected to the working voltage through the second pull-up resistor 124. In this embodiment, the working voltage is +5V. A second output end 102-4 of the first optical coupler 102 and a second output end 104-4 of the second optical coupler 104 are grounded.

In an embodiment of the present invention, the circuit for three-phase detection may just include two optical couplers for detecting a state of a three-phase alternating current, and therefore, has simplified circuit structure and lower costs.

According to an embodiment of the present invention, the circuit for three-phase detection may be used to detect phases of a three-phase alternating current of apparatus that uses the three-phase alternating current, which will be described below with reference to FIG. 5, by taking a compressor as an example.

Figure 5:
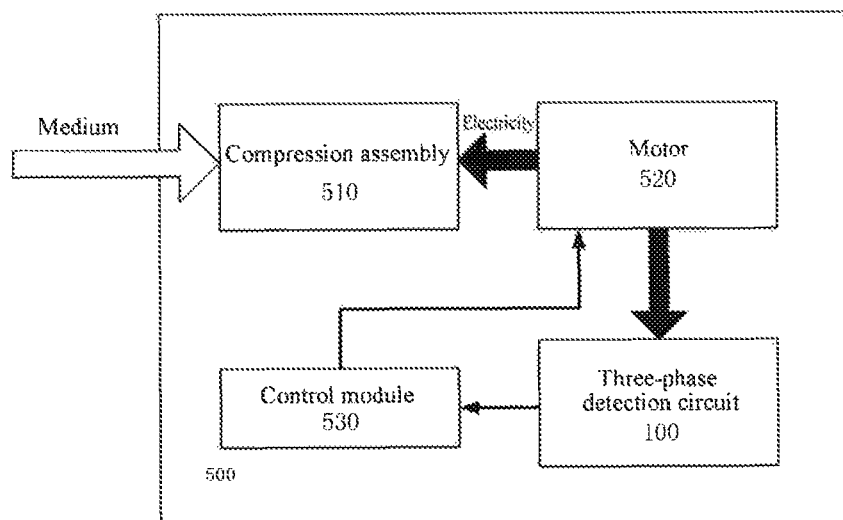
FIG. 5 shows a compressor including a circuit for three-phase detection according to an embodiment of the present invention.

As shown in FIG. 5, a compressor 500 may include a compression member 510, a motor 520 and the circuit for three-phase detection 100 described above. The motor 520 is configured to drive the compression member 510 to compress media that enter the compressor 500, and the circuit for three-phase detection 100 is connected to the motor 520, and is configured to detect a phase state of the motor 520.

Optionally, the compressor 500 may further include: a control module 530, configured to alarm and/or control on/off of the motor according to the phase state that is detected by the circuit for three-phase detection 100.

Figure 6:
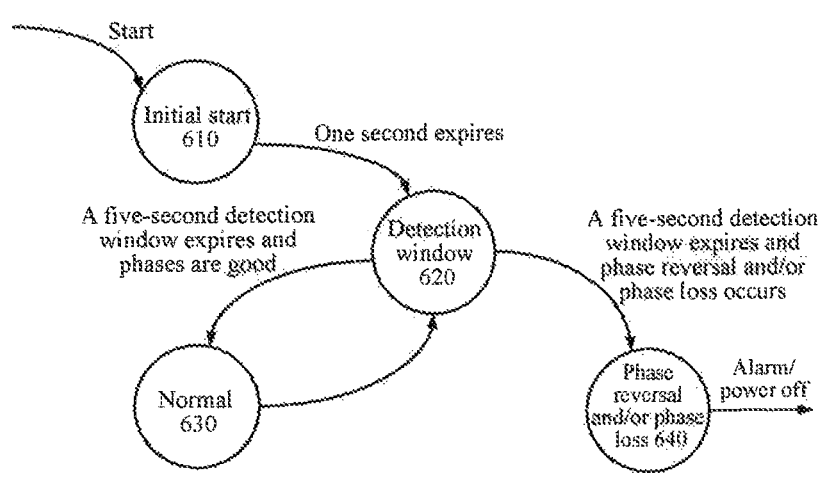
FIG. 6 shows a flowchart of detecting phases of a three-phase alternating current according to an embodiment of the present invention.

FIG. 6 shows a flowchart of detecting phases of a three-phase alternating current of the compressor according to an embodiment of the present invention. As shown in FIG. 6, in a state 610, the circuit for three-phase detection 100 is initially started in response to a start command, and turns on a relay of the compressor, for example, in one second, to detect the phase state of the motor 520. After the one second expires, a state 620, for example, a five-second detection window, is started. The circuit for three-phase detection 100 starts performing detection, for example, at the third second of the five-second detection window, to prevent electrical noise of an initial stage. If the five-second detection window expires and the phases are good, it is determined that the motor 520 is in a normal state 630, and the state 620 is started again and the detection is continued. If the five-second detection window expires and phase reversal and/or phase loss occurs, a state 640 is started to give an alarm by using a sound or optical signal and optionally turn off the motor.

A person skilled in the art may understand that, the embodiment shown in FIG. 6 is merely examples, and each time length may be changed according to an actual requirement. For example, the relay of the compressor may be turned on in more than or less than one second, or it may take more than or less than one second from initial start to the first detection window. A time length of the detection window may be more than five seconds, and may be adjusted according to an actual requirement. In each detection window, the detection may be started at a time point other than the third second of the detection window. The detection process may include more or less states, to be adaptive to requirements of different application scenarios.

According to embodiments of the present invention, phases of a three-phase alternating current may be detected by using two output signals and by using a simplified circuit. The circuit in the embodiments of the present invention is simplified, fewer components are needed, and thereby production costs are obviously reduced while reliability is improved. In addition, the micro control unit according to the embodiments of the present invention may store a detection result, facilitating later data analysis and product maintenance, or generating an alarm signal or turning off a power supply apparatus or electrical appliance when the phase loss and/or phase reversal is detected. Consequently, embodiments of the present invention may be used to provide multiple functions, and can facilitate interaction with another detection device.

The principle of the present invention is described above with reference to specific embodiments. A person skilled in the art may understand that, details listed above are merely used to describe rather than limit the present invention. Steps included in the foregoing method may be implemented in different sequences, provided that objectives of the present invention can be implemented in the sequence. The protection scope of the present invention is defined by the appended claims and an equivalent thereof.

What is claimed is:

1. A circuit for three-phase detection, comprising a first optical coupler and a second optical coupler; wherein
   a first input end and a second input end of the first optical coupler are respectively connected to a first phase wire and a third phase wire of a power supply assembly, and a first output end of the first optical coupler provides a first output signal; and
   a first input end and a second input end of the second optical coupler are respectively connected to a second phase wire and the third phase wire of the power supply assembly, and a first output end of the second optical coupler provides a second output signal;
   wherein the first output signal and the second output signal are used to indicate a phase state of a three-phase alternating current;
   wherein when the first output signal maintains a high electrical level and the second output signal is a square wave signal, it indicates that phase loss occurs in the first phase wire;
   when the second output signal maintains a high electrical level and the first output signal is a square wave signal, it indicates that phase loss occurs in the second phase wire;
   when the first output signal and the second output signal are square wave signals with a same phase, it indicates that phase loss occurs in the third phase wire; and
   when both the first output signal and the second output signal maintain high electrical levels, it indicates that phase loss occurs in at least two wires of the first, second, and third phase wires.

2. The circuit for three-phase detection according to claim 1, further comprising a micro control unit, wherein the micro control unit comprises a first input end and a second input end, wherein the first output end of the first optical coupler is connected to the first input end of the micro control unit, and the first output end of the second optical coupler is connected to the second input end of the micro control unit; and
   the micro control unit is configured to detect, based on the first output signal and the second output signal, phase loss and/or phase reversal of the three-phase alternating current.

3. The circuit for three-phase detection according to claim 1, wherein the first output signal and the second output signal are square wave signals, and when a rising edge of the first output signal does not precede a rising edge of the second output signal by ⅓ of a period of the square wave signal, it indicates that phase reversal occurs in two wires of the first, second, and third phase wires.

4. The circuit for three-phase detection according to claim 1, further comprising:
   a first sampling resistor, wherein the first input end of the first optical coupler is connected to the first phase wire through the first sampling resistor;
   a second sampling resistor, wherein the first input end of the second optical coupler is connected to the second phase wire through the second sampling resistor; and
   a third sampling resistor, wherein the second input end of the first optical coupler and the second input end of the second optical coupler are connected to the third phase wire through the third sampling resistor.

5. The circuit for three-phase detection according to claim 4, further comprising:
   a first diode, connected between the first input end and the second input end of the first optical coupler; and
   a second diode, connected between the first input end and the second input end of the second optical coupler.

6. The circuit for three-phase detection according to claim 4, further comprising:
   a first pull-up resistor, wherein the first output end of the first optical coupler is connected to a working voltage through the first pull-up resistor; and
   a second pull-up resistor, wherein the first output end of the second optical coupler is connected to the working voltage through the second pull-up resistor, wherein
   a second output end of the first optical coupler and a second output end of the second optical coupler are grounded.

7. A compressor, comprising: a compression member, a motor, and a circuit for three-phase detection, wherein the motor is configured to drive the compression member to compress a medium that enters the compressor; and the circuit for three-phase detection is connected to the motor, and is configured to detect a phase state of the motor;
   wherein the circuit for three-phase detection comprises a first optical coupler and a second optical coupler; wherein
   a first input end and a second input end of the first optical coupler are respectively connected to a first phase wire and a third phase wire of a power supply assembly for the motor, and a first output end of the first optical coupler provides a first output signal; and
   a first input end and a second input end of the second optical coupler are respectively connected to a second phase wire and the third phase wire of the power supply assembly, and a first output end of the second optical coupler provides a second output signal;

wherein the first output signal and the second output signal are used to indicate the phase state of a three-phase alternating current of the power supply assembly for the motor;

wherein when the first output signal maintains a high electrical level and the second output signal is a square wave signal, it indicates that phase loss occurs in the first phase wire;

when the second output signal maintains a high electrical level and the first output signal is a square wave signal, it indicates that phase loss occurs in the second phase wire;

when the first output signal and the second output signal are square wave signals with a same phase, it indicates that phase loss occurs in the third phase wire; and when both the first output signal and the second output signal maintain high electrical levels, it indicates that phase loss occurs in at least two wires of the first, second, and third phase wires.

8. The compressor according to claim 7, further comprising: a control module, configured to alarm and/or control on/off of the motor according to the phase state that is detected by the circuit for three-phase detection.

9. The compressor according to claim 8, further comprising a micro control unit, wherein the micro control unit comprises a first input end and a second input end, wherein the first output end of the first optical coupler is connected to the first input end of the micro control unit, and the first output end of the second optical coupler is connected to the second input end of the micro control unit; and the micro control unit is configured to detect, based on the first output signal and the second output signal, phase loss and/or phase reversal of the three-phase alternating current.

10. A method for three-phase detection, comprising:

receiving, by a first optical coupler, a signal of a first phase wire and a signal of a third phase wire that are from a power supply assembly, and outputting a first output signal according to the signal of the first phase wire and the signal of the third phase wire;

receiving, by a second optical coupler, a signal of a second phase wire and the signal of the third phase wire of the power supply assembly, and providing a second output signal according to the signal of the second phase wire and the signal of the third phase wire; and detecting, based on the first output signal and the second output signal, a phase state of a three-phase alternating current of the power supply assembly;

wherein the detecting, based on the first output signal and the second output signal, the phase state of the three-phase alternating current comprises: detecting the phase loss of the three-phase alternating current according to at least one of the following:

when the first output signal maintains a high electrical level and the second output signal is a square wave signal, determining that phase loss occurs in the first phase wire;

when the second output signal maintains a high electrical level and the first output signal is a square wave signal, determining that phase loss occurs in the second phase wire;

when the first output signal and the second output signal are square wave signals with a same phase, determining that phase loss occurs in the third phase wire; and when both the first output signal and the second output signal maintain high electrical levels, determining that phase loss occurs in at least two of the first, second, and third phase wires.

11. The method for three-phase detection according to claim 10, wherein the detecting, based on the first output signal and the second output signal, the phase state of the three-phase alternating current comprises: detecting, based on the first output signal and the second output signal, phase loss and/or phase reversal of the three-phase alternating current.

12. The method for three-phase detection according to claim 10, wherein the detecting, based on the first output signal and the second output signal, the phase state of the three-phase alternating current comprises: when both the first output signal and the second output signal are square wave signals and a rising edge of the first output signal does not precede a rising edge of the second output signal by $\frac{1}{3}$ of a period of the square wave signal, determining that phase reversal occurs in two of the first, second, and third phase wires.

13. The method for three-phase detection according to claim 10, further comprising: performing the method for three-phase detection circularly in a detection window until phase abnormality is detected.

14. The method for three-phase detection according to claim 13, further comprising: alarming and/or stopping power supply when the phase abnormality is detected.

* * * * *